United States Patent
Phillips et al.

(10) Patent No.: US 7,960,755 B2
(45) Date of Patent: Jun. 14, 2011

(54) STRAINED QUANTUM-WELL SEMICONDUCTOR DEVICES

(75) Inventors: Timothy J Phillips, Malvern (GB); Timothy Ashley, Malvern (GB)

(73) Assignee: QinetiQ Limited, London (GB)

( * ) Notice: Subject to any disclaimer, the term of this patent is extended or adjusted under 35 U.S.C. 154(b) by 636 days.

(21) Appl. No.: 10/577,938

(22) PCT Filed: Nov. 8, 2004

(86) PCT No.: PCT/GB2004/004722
§ 371 (c)(1),
(2), (4) Date: May 3, 2006

(87) PCT Pub. No.: WO2005/053030
PCT Pub. Date: Jun. 9, 2005

(65) Prior Publication Data
US 2007/0029574 A1 Feb. 8, 2007

(30) Foreign Application Priority Data

Nov. 20, 2003 (GB) .................................... 0326993

(51) Int. Cl.
*H01L 31/0328* (2006.01)
*H01L 31/0336* (2006.01)
*H01L 31/072* (2006.01)
*H01L 31/109* (2006.01)
(52) U.S. Cl. ...................................................... 257/192
(58) Field of Classification Search .................. 257/192
See application file for complete search history.

(56) References Cited

U.S. PATENT DOCUMENTS

| 5,241,197 | A | 8/1993 | Murakami et al. |
| 5,298,441 | A | 3/1994 | Goronkin et al. |
| 2003/0080332 | A1 | 5/2003 | Phillips |
| 2005/0054172 | A1* | 3/2005 | Feng et al. .................. 438/313 |
| 2005/0194613 | A1* | 9/2005 | Phillips ........................ 257/194 |
| 2006/0261888 | A1* | 11/2006 | Bakalski ....................... 330/51 |

FOREIGN PATENT DOCUMENTS

| EP | 0 241 988 A2 | 10/1987 |
| EP | 1 187 218 A2 | 3/2002 |
| JP | 3-88369 | 4/1991 |

(Continued)

OTHER PUBLICATIONS

International Search Report of PCT/GB2004/004722, mailed Jan. 31, 2005.

(Continued)

*Primary Examiner* — Howard Weiss
(74) *Attorney, Agent, or Firm* — Nixon & Vanderhye P.C.

(57) ABSTRACT

In a transistor in which the majority carriers are holes, at least one narrow bandgap region or layer is doped p-type or contains an excess of holes and is subject to compressive mechanical strain, whereby hole mobility may be significantly increased. In a p-channel quantum well FET, the quantum well InSb well p-type layer 5 (modulation or directly doped) lies between $In_{1-x}Al_xSb$ layers 4, 6 where x is of a value sufficient to induce strain in layer 5 to an extent that light and heavy holes are separated by much more than kT. Transistors falling within the invention, including bipolar pnp devices, may be used with their more conventional electron majority carriers counterparts in complementary logic circuitry.

14 Claims, 3 Drawing Sheets

FOREIGN PATENT DOCUMENTS

| | | |
|---|---|---|
| JP | 3-187269 | 8/1991 |
| JP | 6-53255 | 2/1994 |
| WO | 01/93337 A1 | 12/2001 |
| WO | 03/081674 A1 | 10/2003 |

OTHER PUBLICATIONS

GB Search Report of GB 0326993.3, dated Apr. 23, 2004.

Lott et al, "Strained *p*-Channel InGaSb/AlGaSb Modulation-Doped Field-Effect Transistors", Electronics Letters, vol. 28, No. 15, Jul. 16, 1992, pp. 1459-1460, XP000307703.

Patent Abstracts of Japan, JP 01 009656 A, vol. 13, No. 184, Jan. 12, 1989.

Cui et al., "Technology and First Electrical Characteristics of Complementary NPN and PNP InAlAs/InGaAs Heterojunction Bipolar Transistors", Japanese Journal of Applied Physics, vol. 41, No. 2B, Part 1, Feb. 2002, pp. 1124-1130, XP001192196.

Patent Abstracts of Japan, JP 63 051678 A, vol. 012, No. 268, Mar. 4, 1988.

* cited by examiner

InSb/InAlSb L=50Å ε=1%

InSb/InAlSb L=100Å ε=1%

InSb/InAlSb L=50Å ε=1%

InSb/InAlSb L=100Å ε=1%

STRAINED QUANTUM-WELL SEMICONDUCTOR DEVICES

This application is the U.S. national phase of international application PCT/GB2004/004722, filed 8 Nov. 2004, which designated the U.S. and claims priority of GB 0326993.3, filed 20 Nov. 2003, the entire contents of each of which are hereby incorporated by reference.

The present invention relates to semiconductor devices in which a narrow bandgap semiconducting region is subject to strain.

Narrow bandgap semiconductors such as indium antimonide InSb have useful properties such as very low electron effective mass, very high electron mobility and high saturation velocity. These are potentially of great interest for ultra high-speed transistor applications. InSb in particular is a promising material for fast very low power dissipation transistors, because its electron mobility $\mu_e$ at low electric fields is nine times higher that than of GaAs, and its saturation velocity $v_{sat}$ is more than five times higher, despite GaAs having better properties than silicon in these respects. InSb is also predicted to have a large ballistic mean free path of over 0.5 microns. This suggests that InSb would be very suitable for high-speed low voltage operation, and the consequent low power consumption would make it ideal for portable and high device-density applications.

The application of strain to a semiconductor is an established way of altering its characteristics. While it has chiefly been applied to electro-optic devices such as lasers and photodetectors, U.S. Pat. No. 5,382,814 discloses a MISFET which includes an $Al_xIn_{1-x}Sb$ layer which contains 15% Al. This layer is expansively strained because the addition of the Al atoms into the lattice reduces the lattice constant relative to the adjacent material. However, in this prior art $p^+p^+$(wide gap)$p^-n^+$ structure the $Al_xIn_{1-x}Sb$ wide gap layer is intended to act as a barrier in the conduction band to prevent electrons from moving from the $p^+$ contact region into the $p^-$ active region. It does not act as a layer in and along which carrier transport occurs, and the presence of strain therein is not fundamental to operation of the device.

It is now appreciated that it is possible to construct transistors with a compressively strained region or layer where the presence of the strain usefully affects the transistor properties.

Accordingly the present invention provides a transistor including at least one narrow bandgap region or layer that is doped p-type or contains an excess of holes and is subject to compressive mechanical strain.

Preferably the narrow bandgap is no more than 1.0 eV, preferably no more than 0.75 eV, and most preferably no more than 0.5 eV. In materials with such narrow bandgaps the strain effect on the bands is most likely to be large enough to be useful.

The compressive mechanical strain may be imposed upon the narrow bandgap region by being adjacent at least one further layer or region having a different lattice constant. Preferably there is at least one further layer or region on each of two opposed sides of the narrow bandgap layer or region.

In devices according to the invention the majority carriers in the strained region will be holes. Commonly, the strained region or layer will be one permitting carrier transport in use and often will be the one in which the main carrier transport occurs, e.g. in and along such a layer.

The invention may be applied inter alia to FETs, for example p-channel quantum well effect FETs, and also to bipolar transistors, e.g. n-p-n transistors.

Our International Patent Application No. PCT/GB03/01148 discloses and claims a quantum well field effect transistor wherein the quantum well is provided by a primary conduction channel and at least one secondary conduction channel immediately adjacent and in contact with the primary channel, the secondary channel having an effective bandgap greater than the effective bandgap Eg (effective) of the primary channel, wherein the modulus of the difference between the effective impact ionisation threshold IIT (effective) and the effective conduction band offset $\Delta E_C$ (effective) between the primary and secondary channels being no more than 0.5 Eg (effective). It also discloses and claims a quantum well field effect transistor wherein the quantum well is provided by a primary conduction channel and at least one secondary conduction channel immediately adjacent and in contact with the primary channel, the secondary channel having an effective bandgap greater than the effective bandgap Eg (effective) of the primary channel, wherein the modulus of the difference between the effective impact ionisation threshold IIT (effective) and the effective conduction band offset $\Delta E_C$ (effective) between the primary and secondary channels being no more than 0.4 eV.

Our earlier UK Patent Application Serial No. 2 362 506 discloses and claims an extracting transistor characterised in that (a) it is a field effect transistor incorporating a conducting region consisting at least partly of a quantum well; (b) the quantum well is in an at least partly intrinsic conduction regime when the transistor is unbiased and at a normal operating temperature; and (c) it includes at least one junction which is biasable to reduce the intrinsic conduction in the quantum well and confine charge carriers predominantly to one type only corresponding to an extrinsic saturated regime.

Our International Patent Application No. PCT/GB02/05904 discloses and claims a bipolar transistor with a vertical geometry having a base region provided with a base contact, emitter and collector regions arranged to extract minority carriers from the base region, and a structure for counteracting entry of minority carriers into the base region via the base contact, wherein the base region has a bandgap of greater than 0.5 eV and a doping level greater than $10^{17}$ cm$^{-3}$. In a structure of this type the base can be compressively strained to allow light hole transport as is necessary in an efficient n-p-n device.

In addition, our International Patent Application No. PCT/GB01/02284 discloses and claims a bipolar transistor having emitter and collector regions arranged to extract minority carriers from the base region, a structure for counteracting entry of minority carriers into the base region via the base contact, the base region having a band gap less than 0.5 eV and wherein the base region has a doping level greater than $10^{17}$ cm$^{-3}$.

While the present invention is not limited to these prior art constructions, such quantum well FETs and bipolar transistors may be based inter alia on InSb. In such a case the presence of an $Al_xIn_{1-x}Sb$ layer or layers having a significantly lower lattice constant will introduce a strongly compressive strain into the quantum well or base region respectively. The strain effect in the InSb material is very strong and in principle allows the energies of the light and heavy holes to be split by an amount much greater than kT. As the mobility of the light holes in InSb (in a lower energy band than the heavy holes) is almost as great as that of the electrons (and much greater than the mobility of the heavy holes which normally predominate transport in unstrained InSb), this gives rise to the possibility of making high performance hole-based devices. When the latter devices are used in conjunction with the corresponding but more conventional electron-based ones, this permits the design of very high-speed low power complementary logic circuits having good circuit performance and low quiescent power consumption.

The strain effect is strong in InSb and accordingly a preferred material for the compressively strained narrow bandgap region is InSb. However, it is possible to use other materials such as InAs in a similar manner in transistors according to the invention.

Further features and advantage of the invention will become clear upon a perusal of the appended claims, to which the reader is directed, and upon consideration of the following more detailed description of embodiments of the invention, made with reference to the accompanying drawings, in which:

Figure 1:
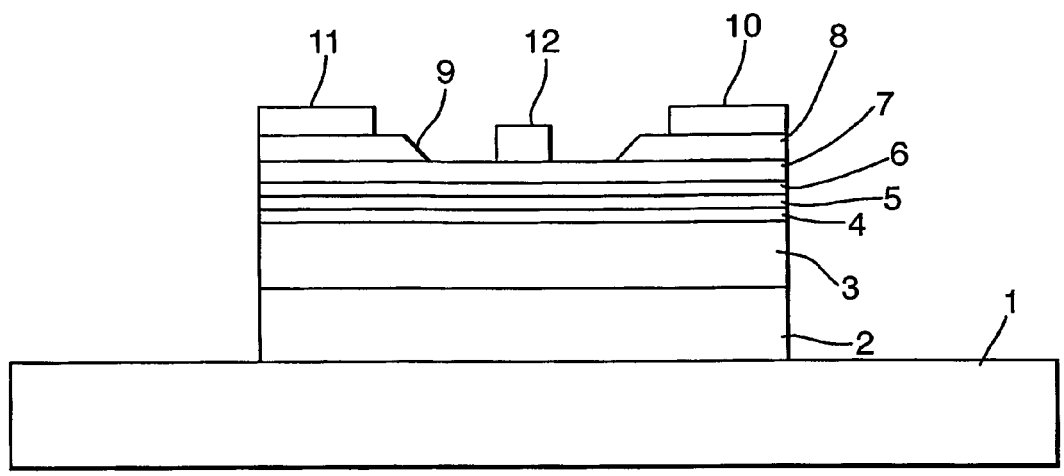
FIG. 1 shows in diagrammatic cross-section a quantum well FET according to the invention.

In FIG. 1 an optional highly n-type doped back contact layer 2 for carrier extraction lies directly upon an insulating substrate 1, for example of GaAs. A layer 5 of InSb which is modulation doped or directly doped with p-type dopants forms a quantum well between layers 4 and 6 of $In_{1-x}Al_xSb$. If used, modulation doping is provided by sheets of dopant between layers 6 and 7, or between layers 3 and 4, or between both. A further layer 3 of $In_{1-x}Al_xSb$ lies between layer 4 and the back contact 2, and another layer 7 of $In_{1-x}Al_xSb$ overlies the layer 6. Connections to each end of the p-type conduction channel are provided p-type contacts 8, 9 and overlying metallic contacts 10, 11 respectively, and a Schottky gate (or an oxide based gate) 12 is provided to control channel conduction.

The value of x in the layers 4 and 6 is high enough to induce sufficient strain in the layer 5 that the light and heavy holes are separated by an amount much greater than kT.

Typical values of layer thickness and x are as follows:

| Layer 2: | 0.5-3 µm thick; | x = 0.15-0.30 |
| Layer 3: | 0.5-0.75 µm thick; | x = 0.15-0.30 |
| Layer 4: | 3-10 nm thick; | x = 0.15-0.30 |
| Layer 5: | 5-20 nm thick; | |
| Layer 6: | 3-10 nm thick; | x = 0.15-0.30 |
| Layer 7: | 10-20 nm thick; | x = 0.15-0.30 |

Figure 2:
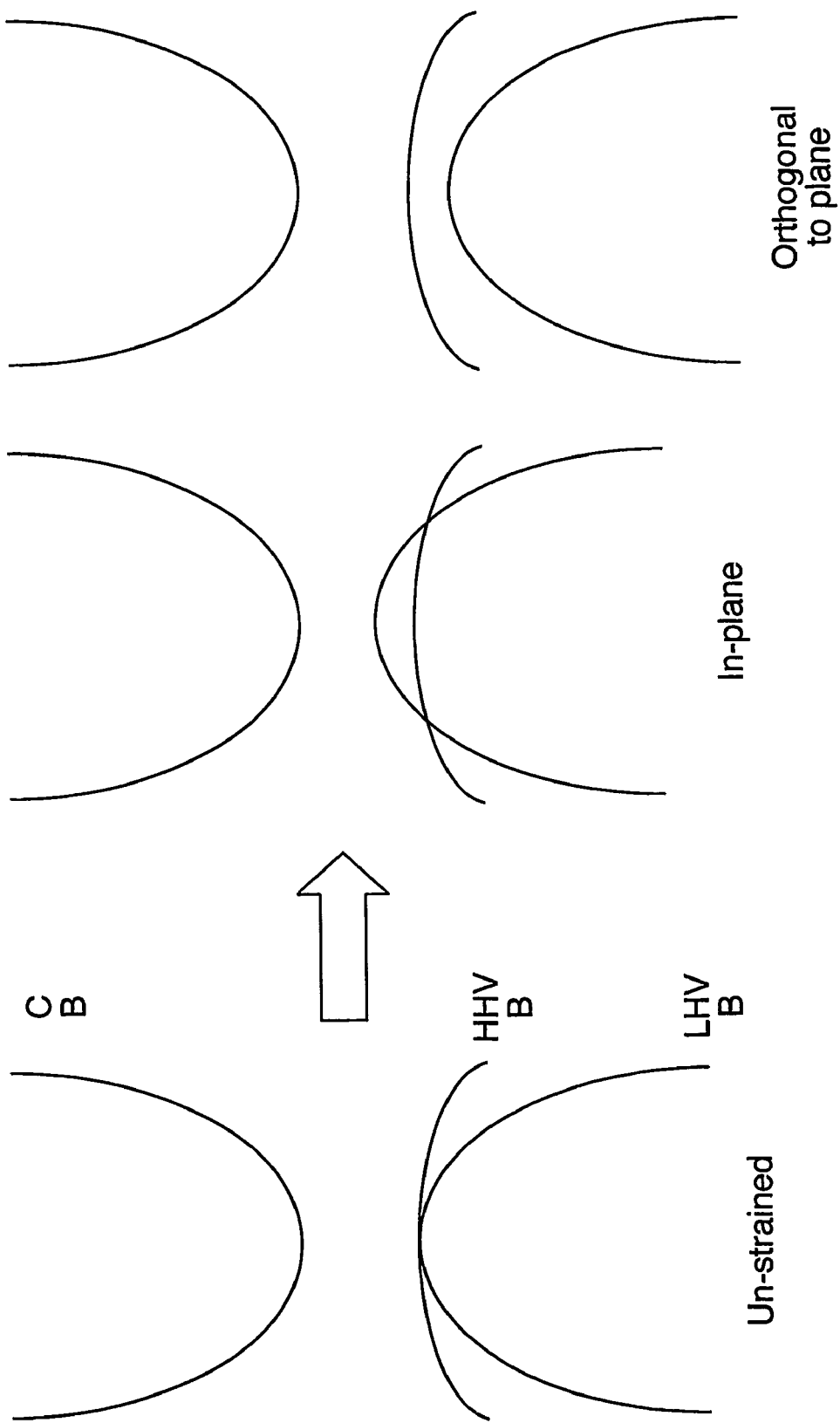
FIG. 2 illustrates pictorially the effect of compressive strain on a quantum well layer of the type illustrated in the transistor of FIG. 1.

FIG. 2 illustrates pictorially the effect of compressive strain on band structure, for example in a quantum well transistor of the general construction of FIG. 1, and the crossing of the heavy and light hole bands in-plane is to be noted, whereas the two bands separate orthogonal to the plane.

Figure 3A:
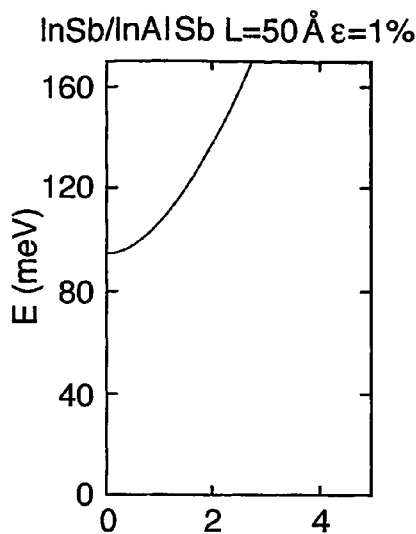
FIG. 3(a-d) show calculated dispersions for a quantum well transistor of the type illustrated in FIG. 1.
Figure 3C:
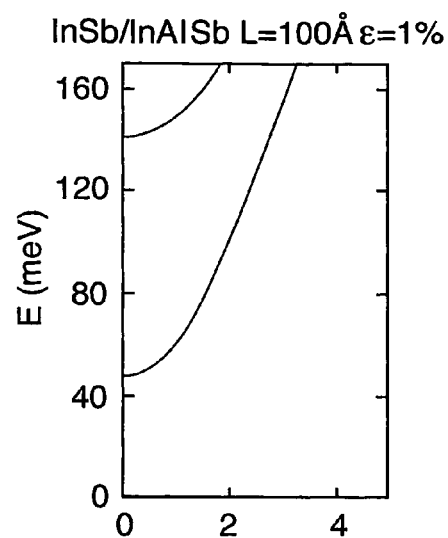
Figure 3B:
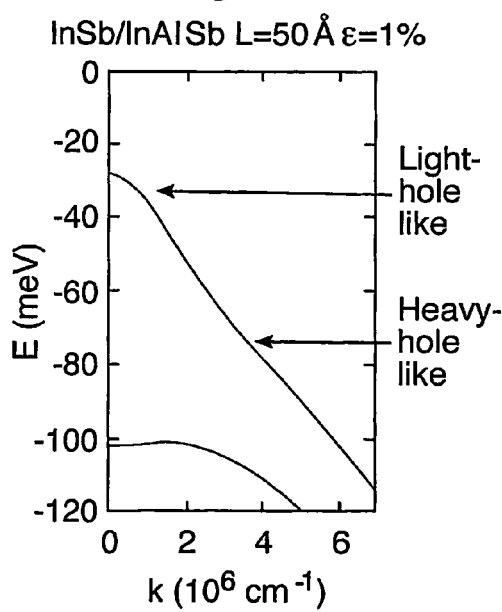
Figure 3D:
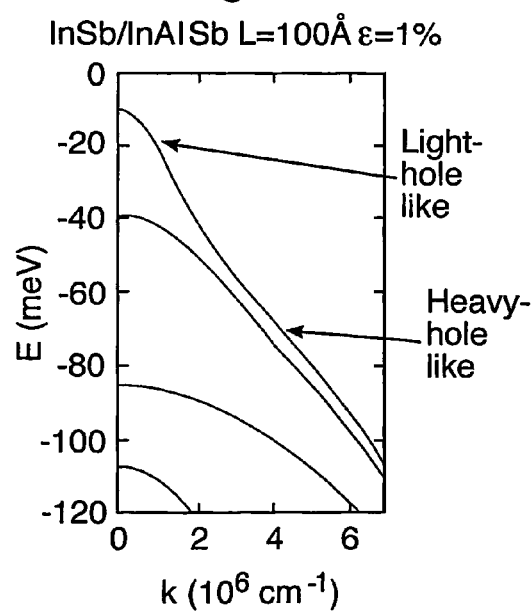

FIG. 3(a-d) show the calculated in-plane sub-band dispersions for a quantum well transistor of the general construction of FIG. 1, with an InSb quantum well between barriers of $In_{0.81}Al_{0.19}Sb$ in cases where the well is 5 nm thick (FIGS. 3(a) and 2(b)), and 10 nm thick (FIGS. 3(c) and 3(d)). The plots provide good evidence for the existence of "heavy" and "light" holes. Initial calculations suggest that a sheet hole density in the $10^{11}$ to $10^{12}$ $cm^{-1}$ range is achievable with the holes having a mobility comparable to the electron mobility, giving the potential for a good matching of device characteristics in complementary device circuitry.

Figure 4:
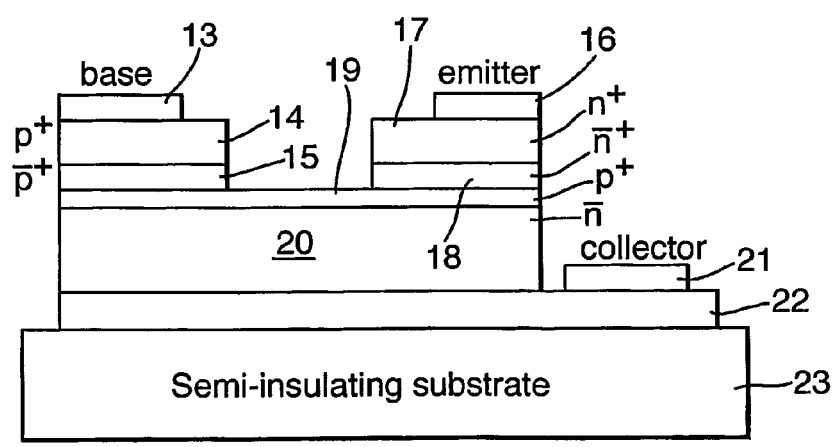
FIG. 4 shows in diagrammatic cross-section a bipolar transistor according to the invention.

FIG. 4 shows an n-p-n bipolar transistor in which the base region 19 is of p-type doped InSb. The base also comprises the base contact metal 13 upon a $p^+$ layer 14. A further $p^+$ layer 15 lies between and in contact with the region 19 and the layer 14. The emitter comprises the emitter contact metal 16 upon an $n^+$ layer 17. A further $n^+$ layer 18 lies between and in contact with the layer 17 and the base region 19. The collector comprises an $n^+$ layer 22 between and in contact with a semi-insulating substrate 23 and the n collector layer 20. There is an ohmic contact metal layer 21 upon layer 22, and the layer 20 lies between and in contact with the layer 22 and the base region 19. Each of layers 15, 18, 20 and 22 are of wider bandgap (and smaller lattice constant) $Al_xIn_{1-x}Sb$, the presence of which imparts a compressive strain to the narrower bandgap base layer 19. The construction should allow the base layer 20 to be strained, thereby affording light hole transport and permitting faster device speed with lower base access resistance for improved power gain.

Typical values of layer thickness and x are as follows:

| Layer 14: | 5-20 nm thick | |
| Layer 15: | 5-20 nm thick | x = 0.15-0.30 |
| Layer 17: | 5-20 nm thick | |
| Layer 18: | 5-20 nm thick | x = 0.15-0.30 |
| Layer 19: | 5-20 nm thick | |
| Layer 20: | 0.3-2 µm thick | x = 0.15-0.30 |
| Layer 22: | 0.5-5 µm thick | x = 0.15-0.30 |

The invention claimed is:

1. A transistor including at least one narrow bandgap region under compressive mechanical strain comprising at least one of a doped p-type material and a material containing an excess of holes, wherein said narrow bandgap region is in contact with at least one layer having a different lattice constant and said narrow bandgap region is subject to said compressive mechanical strain, wherein there are at least two further layers, one on each side of said narrow bandgap region, wherein said transistor is a quantum-well FET.

2. A transistor according to claim 1 wherein said narrow bandgap region is arranged for majority carrier transport.

3. A transistor according to claim 1 wherein said narrow bandgap region comprises InSb or InAs.

4. A transistor according to claim 1 wherein the quantum well is provided by a primary conduction channel and at least one secondary conduction channel immediately adjacent and in contact with the primary channel, the secondary channel having an effective bandgap greater than the effective bandgap Eg (effective) of the primary channel, wherein the modulus of the difference between the effective impact ionisation threshold IIT (effective) and the effective conduction band offset $\Delta E_C$ (effective) between the primary and secondary channels being no more than 0.5 Eg (effective).

5. A transistor according to claim 4 wherein the quantum well is provided by a primary conduction channel and at least one secondary conduction channel immediately adjacent and in contact with the primary channel, the secondary channel having an effective bandgap greater than the effective bandgap Eg (effective) of the primary channel, wherein the modulus of the difference between the effective impact ionisation threshold IIT (effective) and the effective conduction band offset $\Delta E_C$ (effective) between the primary and secondary channels being no more than 0.4 eV.

6. A transistor according to claim 1 in the form of an extracting transistor characterised in that (a) it is a field effect transistor incorporating a conducting region consisting at least partly of a quantum well; (b) the quantum well is in an at least partly intrinsic conduction regime when the transistor is unbiased and at a normal operating temperature; and (c) it includes at least one junction which is biasable to reduce the intrinsic conduction in the quantum well and confine charge carriers predominantly to one type only corresponding to an extrinsic saturated regime.

7. A transistor according to claims 1 wherein the transistor is an n-p-n bipolar transistor.

8. A transistor according to claim 7 with a vertical geometry having a base region provided with a base contact, emitter and collector regions arranged to extract minority carriers from the base region, and a structure for counteracting entry of minority carriers into the base region via the base contact, wherein the base region has a bandgap of greater than 0.5 eV and a doping level greater than $10^{17}$ cm$^{-3}$.

9. A transistor according to claim 1 wherein the narrow bandgap is no more than 1.0 eV.

10. A complementary logic circuit comprising a transistor according to claim 1.

11. An integrated circuit comprising a transistor according to claim 1.

12. A quantum-well field effect transistor including at least one narrow bandgap region or layer that is doped p-type or contains an excess of holes and is subject to compressive mechanical strain, wherein said transistor incorporating a conducting region consisting at least partly of a quantum well; (b) the quantum well is in an at least partly intrinsic conduction regime when the transistor is unbiased and at a normal operating temperature; and (c) it includes at least one junction which is biasable to reduce the intrinsic conduction in the quantum well and confine charge carriers predominantly to one type only corresponding to an extrinsic saturated regime.

13. A transistor including at least one narrow bandgap region under compressive mechanical strain comprising at least one of a doped p-type material and a material containing an excess of holes, wherein the transistor is a quantum-well FET and the quantum well is provided by a primary conduction channel and at least one secondary conduction channel immediately adjacent and in contact with the primary channel, the secondary channel having an effective bandgap greater than the effective bandgap Eg (effective) of the primary channel, wherein the modulus of the difference between the effective impact ionisation threshold IIT (effective) and the effective conduction band offset $\Delta E_C$ (effective) between the primary and secondary channels being no more than 0.5 Eg (effective).

14. A transistor according to claim 13, wherein the quantum well is provided by a primary conduction channel and at least one secondary conduction channel immediately adjacent and in contact with the primary channel, the secondary channel having an effective bandgap greater than the effective bandgap Eg (effective) of the primary channel, wherein the modulus of the difference between the effective impact ionisation threshold IIT (effective) and the effective conduction band offset $\Delta E_C$ (effective) between the primary and secondary channels being no more than 0.4 eV.

\* \* \* \* \*